United States Patent
Shu et al.

(10) Patent No.: US 9,905,472 B1
(45) Date of Patent: Feb. 27, 2018

(54) SILICON NITRIDE CESL REMOVAL WITHOUT GATE CAP HEIGHT LOSS AND RESULTING DEVICE

(71) Applicant: GLOBALFOUNDRIES Inc., Grand Cayman (KY)

(72) Inventors: Jiehui Shu, Clifton Park, NY (US); Jinping Liu, Ballston Lake, NY (US); Haifeng Sheng, Rexford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/440,072

(22) Filed: Feb. 23, 2017

(51) Int. Cl.
| | |
|---|---|
| *H01L 21/768* | (2006.01) |
| *H01L 21/8234* | (2006.01) |
| *H01L 21/02* | (2006.01) |
| *H01L 21/3105* | (2006.01) |
| *H01L 21/311* | (2006.01) |
| *H01L 27/088* | (2006.01) |
| *H01L 23/535* | (2006.01) |
| *H01L 29/40* | (2006.01) |
| *H01L 29/417* | (2006.01) |

(52) U.S. Cl.
CPC .. *H01L 21/823475* (2013.01); *H01L 21/0217* (2013.01); *H01L 21/31053* (2013.01); *H01L 21/31111* (2013.01); *H01L 21/31116* (2013.01); *H01L 21/76802* (2013.01); *H01L 21/76877* (2013.01); *H01L 21/76897* (2013.01); *H01L 21/823431* (2013.01); *H01L 23/535* (2013.01); *H01L 27/0886* (2013.01); *H01L 21/76819* (2013.01); *H01L 21/76831* (2013.01); *H01L 21/76832* (2013.01); *H01L 21/76834* (2013.01); *H01L 29/401* (2013.01); *H01L 29/41725* (2013.01)

(58) Field of Classification Search
CPC ............ H01L 29/401; H01L 29/41725; H01L 21/76819; H01L 21/76831; H01L 21/76832; H01L 21/76834
USPC .......................................... 257/382; 438/672
See application file for complete search history.

(56) References Cited

U.S. PATENT DOCUMENTS

| 9,190,489 B1 * | 11/2015 | Mountsier ......... H01L 21/02175 |
| 2013/0277754 A1 * | 10/2013 | Liang .................. H01L 27/0629 257/379 |
| 2014/0273385 A1 * | 9/2014 | Liang ................ H01L 21/28008 438/299 |

(Continued)

*Primary Examiner* — George Fourson, III
(74) *Attorney, Agent, or Firm* — Ditthavong & Steiner, P.C.

(57) ABSTRACT

A method of removing the CESL from small canyon TS structures of a MOSFET device while maintaining gate cap height and the resulting device are provided. Embodiments include providing two gates laterally separated over and perpendicular to a fin of a semiconductor device, each gate having sidewall spacers and a nitride cap; forming a conformal SiN CESL on bottom and side surfaces of a trench formed between opposing spacers between the gates; filling the trench with oxide; planarizing the spacers, nitride caps, oxide, and CESL; removing the oxide; forming a topological flat-SiN layer over the spacers, nitride caps, and CESL; removing the topological flat-SiN layer from side and bottom surfaces of the trench; removing the CESL and the topological flat-SiN layer down to a top surface of the spacers; and performing contact metallization.

19 Claims, 3 Drawing Sheets

(56) References Cited

U.S. PATENT DOCUMENTS

| | | | |
|---|---|---|---|
| 2015/0243751 A1* | 8/2015 | Liu | H01L 21/76834 257/288 |
| 2015/0287823 A1* | 10/2015 | Ke | H01L 29/7833 257/410 |
| 2016/0064528 A1* | 3/2016 | Lu | H01L 29/66795 257/288 |
| 2016/0225662 A1* | 8/2016 | Lu | H01L 21/76802 |
| 2016/0315171 A1* | 10/2016 | Hung | H01L 29/66545 |
| 2017/0200811 A1* | 7/2017 | Lu | H01L 29/66795 |

* cited by examiner

SILICON NITRIDE CESL REMOVAL WITHOUT GATE CAP HEIGHT LOSS AND RESULTING DEVICE

TECHNICAL FIELD

The present disclosure relates to a manufacture of metal-oxide-semiconductor field-effect transistor (MOSFET) devices. The present disclosure is particularly applicable to the formation of MOSFET silicon nitride (SiN) gate caps for the 7 nanometer (nm) technology node and beyond.

BACKGROUND

Trench silicide (TS) to gate (PC) (TS-PC) shorts are some of the most common and detrimental failure mechanisms in MOSFET device manufacturing, particularly in the 7 nm technology node and beyond. A known approach for forming a MOSFET device consumes approximately 10 nm of the SiN gate caps during the gate stack reactive-ion etching (RIE) process and then approximately 5 nm more during the removal of the contact etch stop layer (CESL) from small canyon TS structures, as depicted in FIGS. 1A through 1C. The CESL needs to be removed from small canyon TS structures for contact resistance (Rhoc) reduction. However, the resulting gate cap loss can lead to TS-PC or source/drain (CA) to PC (CA-PC) shorts.

FIGS. 1A through 1C schematically illustrate cross-sectional views of the known MOSFET formation process flow. Adverting to FIG. 1A, two laterally separated metal gates 101 are formed over and perpendicular to a fin 103 of the MOSFET device. Each metal gate 101 has sidewall spacers 105 and a SiN gate cap 107, e.g., a self-aligned contact (SAC) cap. A conformal SiN CESL 109 is formed on the bottom and side surfaces of the trench 111 formed between opposing spacers 105 between the metal gates 101, and the trench 111 is filled with an oxide 113. The oxide 113 is then removed, e.g., by RIE, which causes approximately 10 nm of the SiN caps 107 to also be removed, as depicted in FIG. 1B. Adverting to FIG. 1C, when the SiN CESL 109 is subsequently removed, e.g., by RIE, an additional 5 nm of the SiN gate caps 107 is lost because there is no selectivity between the SiN gate caps 107 and the SiN CESL 109. Consequently, TS-PC or CA-PC shorts may occur.

A need therefore exists for methodology for protecting MOSFET nitride gate caps during patterning of small canyon TS structures and the resulting device.

SUMMARY

An aspect of the present disclosure is a process of removing the CESL from small canyon TS structures of a MOSFET device while maintaining gate cap height.

Another aspect of the present disclosure is a MOSFET device without gate cap height loss.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing two gates laterally separated over and perpendicular to a fin of a semiconductor device, each gate having sidewall spacers and a nitride cap; forming a conformal SiN CESL on bottom and side surfaces of a trench formed between opposing spacers between the gates; filling the trench with oxide; planarizing the spacers, nitride caps, oxide, and CESL; removing the oxide; forming a topological flat-SiN layer over the spacers, nitride caps, and CESL; removing the topological flat-SiN layer from side and bottom surfaces of the trench; removing the CESL and the topological flat-SiN layer down to a top surface of the spacers; and performing contact metallization.

Aspects of the present disclosure include each gate being a metal gate (MG). Other aspects include each spacer being formed of a low-k material. Further aspects include forming the CESL to a thickness of 2 nm to 8 nm. Another aspect includes removing the oxide by: RIE. Additional aspects include 9 nm to 11 nm of the nitride caps being removed with the oxide. Other aspects include forming the topological flat-SiN layer to a thickness of 2 nm to 8 nm above an upper surface of the spacers and CESL. Further aspects include forming the topological flat-SiN layer using a low plasma density condition. Another aspect includes removing the topological flat-SiN layer from side and bottom surfaces of the trench by: dilute hydrofluoric (dHF) wet etch. Additional aspects include removing the CESL by: a wet or a dry isotropic etch. Other aspects include 9 nm to 11 nm of the topological flat-SiN layer remaining above the nitride caps between the spacers subsequent to removing the CESL.

Another aspect of the present disclosure is a device including: two gates laterally separated over and perpendicular to a fin of a semiconductor device; a SiN cap on top of each gate; spacers on opposite sides of each gate and nitride cap; a topological flat-SiN layer on top of each nitride cap between the spacers; and a metal contact layer on the fin and adjacent to opposing spacers between the gates.

Aspects of the device include each gate being a MG. Other aspects include each spacer being formed of a low-k material. Further aspects include the topological flat-SiN layer being coplanar with an upper surface of the spacers.

A further aspect of the present disclosure is a method including: providing two metal gates laterally separated over and perpendicular to a fin of a semiconductor device, each gate having low-k spacers at opposite sides and a nitride cap; forming a conformal SiN CESL on bottom and side surfaces of a trench formed between opposing spacers between the gates; filling the trench with oxide; planarizing the spacers, nitride caps, oxide, and CESL; removing the oxide by RIE; forming a topological flat-SiN layer over the spacers, nitride caps, and CESL using a low plasma density condition; removing the topological flat-SiN layer from side and bottom surfaces of the trench by a dHF wet etch; removing the CESL and a portion of the topological flat-SiN layer above an upper surface of the spacers and nitride caps by a wet or a dry isotropic etch; and performing contact metallization.

Aspects of the present disclosure include forming the CESL to a thickness of 2 nm to 8 nm. Other aspects include 9 nm to 11 nm of the nitride caps being removed with the oxide. Further aspects include forming the topological flat-SiN layer to a thickness of 2 nm to 8 nm above an upper surface of the spacers and CESL. Another aspect includes 9 nm to 11 nm of the topological flat-SiN layer remaining above the nitride caps between the spacers subsequent to removing the CESL.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of gate cap height loss attendant upon removal of the CESL from small canyon TS structures of a MOSFET device. The problem is solved, inter alia, by depositing a SiN layer on the SiN gate caps before removing the CESL to maintain the gate cap height during the subsequent CESL removal process.

Methodology in accordance with embodiments of the present disclosure includes providing two gates laterally separated over and perpendicular to a fin of a semiconductor device, each gate having sidewall spacers and a nitride cap. A conformal SiN CESL is formed on bottom and side surfaces of a trench formed between opposing spacers between the gates. The trench is filled with oxide, and the spacers, nitride caps, oxide, and CESL are planarized. The oxide is removed, and a topological flat-SiN layer is formed over the spacers, nitride caps, and CESL. The topological flat-SiN layer is removed from side and bottom surfaces of the trench. The CESL and the topological flat-SiN layer are removed down to a top surface of the spacers, and contact metallization is performed.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
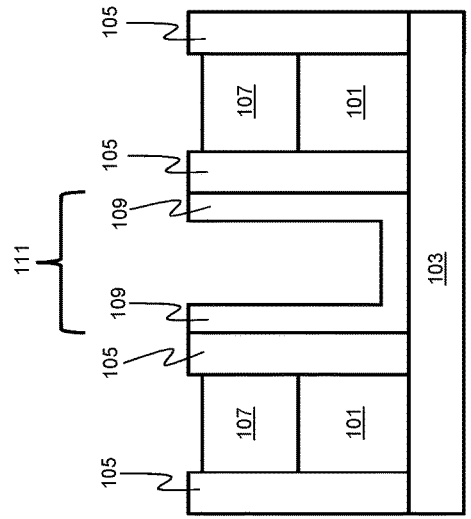
FIGS. 1A through 1C schematically illustrate cross-sectional views of a background process flow for removing the CESL of a MOSFET device.
Figure 1B:
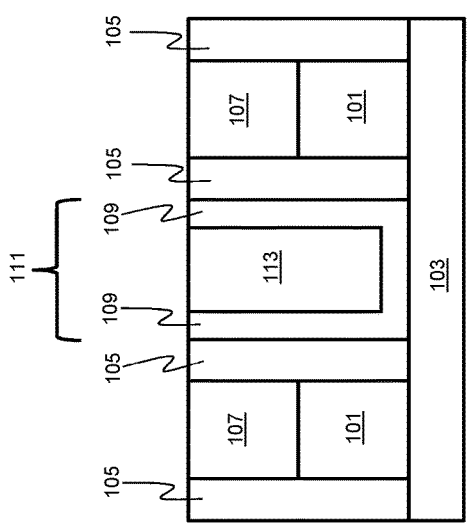
Figure 1C:
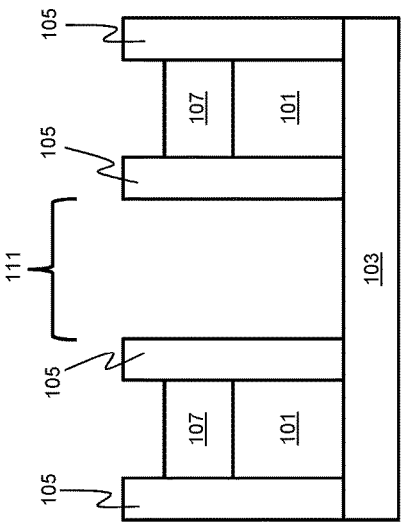
Figure 2:
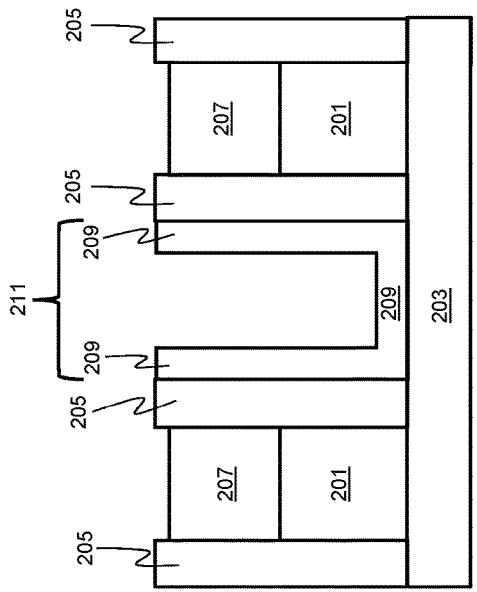
FIGS. 2 through 6 schematically illustrate cross-sectional views of a process flow for removing the CESL of a MOSFET device while maintaining gate cap height, in accordance with an exemplary embodiment.

FIGS. 2 through 6 schematically illustrate cross-sectional views of a process flow for removing the CESL of a MOSFET device while maintaining gate cap height. Adverting to FIG. 2, similar to FIG. 1A, two laterally separated gates 201 are formed over and perpendicular to a fin 203 of the MOSFET device. Each gate 201 has sidewall spacers 205 and a nitride cap 207, e.g., a SiN SAC cap. The gates 201 may be formed, e.g., of metal, and the spacers may be formed, e.g., of a low-k material. A conformal SiN CESL 209 is formed on the bottom and side surfaces of the trench 211 formed between opposing spacers 205 between the gates 201, and the trench 211 is filled with an oxide 213. The CESL 209 may be formed, e.g., to a thickness of 2 nm to 8 nm. The spacers 205, nitride caps 207, oxide 213, and CESL 209 are then planarized, e.g., by CMP.

Figure 3:
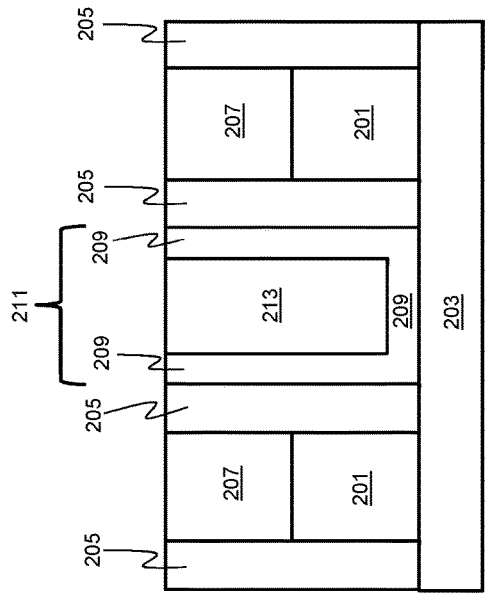
Figure 4:
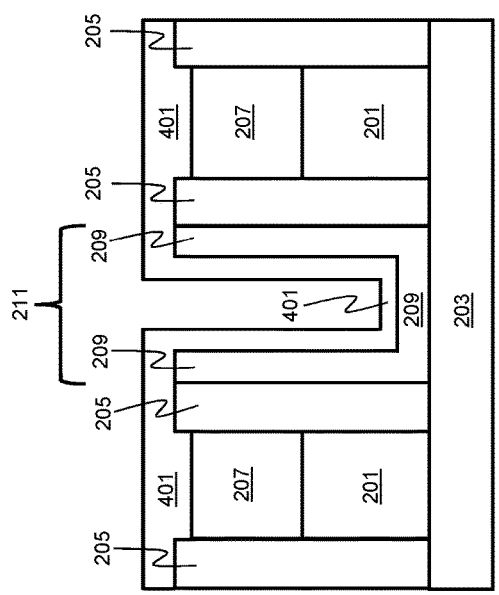

Next, the oxide 213 is removed, e.g., by RIE, as depicted in FIG. 3. Consequently, 9 nm to 11 nm, e.g., 10 nm, of each nitride cap 207 is also removed along with the oxide 213. Adverting to FIG. 4, a topological flat-SiN layer 401 is formed over the spacers 205, nitride caps 207, and CESL 209 including on side and bottom surfaces of the trench 211. The topological flat-SiN layer 401 is formed, e.g., with a thickness of 2 nm to 8 nm, above the upper surface of the spacers 205 and CESL 209. A topological flat-SiN layer 401 may be formed, e.g., by using a low plasma density condition, whereas a high plasma density will primarily form a topological sidewall-SiN layer.

Figure 5:
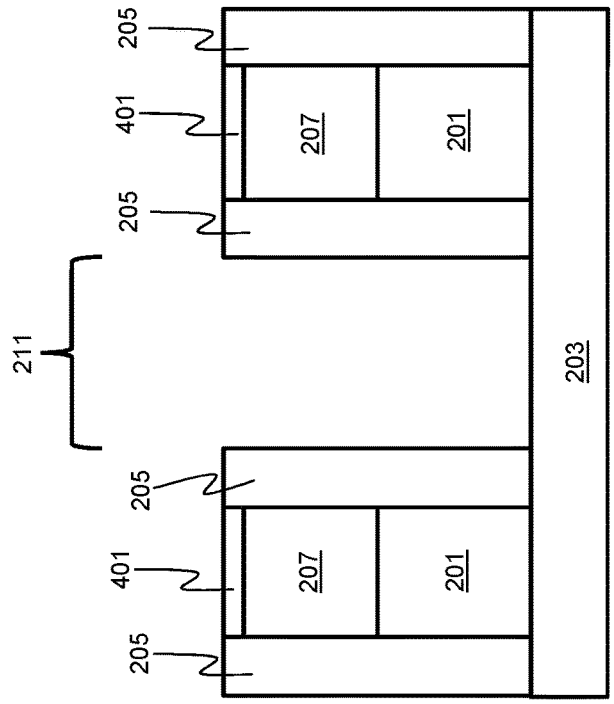
Figure 6:
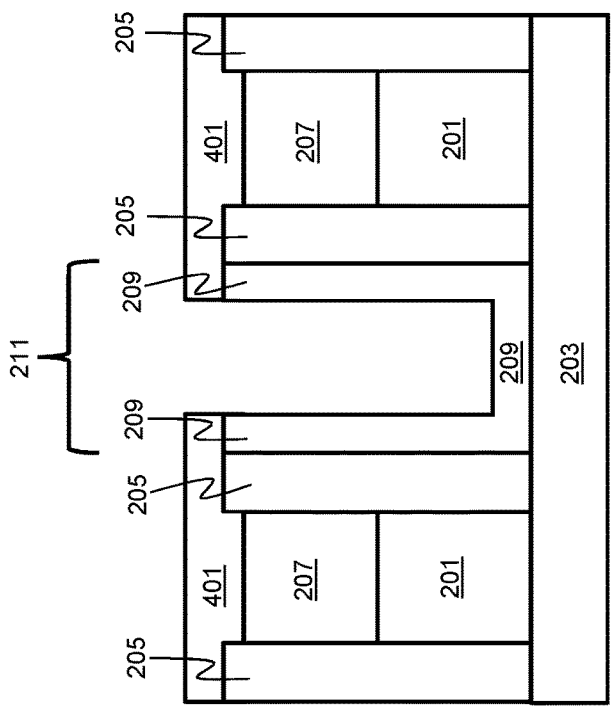

Adverting to FIG. 5, the topological flat-SiN layer 401 is removed, e.g., by a short dHF etch, from the side and bottom surfaces of the trench 211. The wet etch rate (WER) for removing the topological flat-SiN layer 401 may be, e.g., 5 angstrom (A)/minute with 100:1 dHF. The CESL 209 and a portion of the topological flat-SiN layer 401 are then removed, e.g., by a wet or dry isotropic etch, e.g., RIE, down to the top surface of the spacers 205, as depicted in FIG. 6. As discussed above, the CESL 209 is removed from small canyon TS structures such as the trench 211 to reduce the Rhoc. In contrast, the CESL does not need to be removed from large TS features (not shown for illustrative convenience) because the contact area of the large TS features is already relatively big enough to ensure contact. When the CESL 209 is removed from small canyon TS structures, 9 nm to 11 nm of the topological flat-SiN layer 401 remains on and protects the nitride caps 207, thereby maintaining the gate cap height. Thereafter, contact metallization (not shown for illustrative convenience) is performed downstream.

The embodiments of the present disclosure can achieve several technical effects including removing the CESL from small canyon TS structures of a MOSFET device while maintaining gate cap height, thereby improving TS-PC or CA-PC short control. In addition, patterning small and large TS features separately can improve through-pitch and reduce loading effects. Further, only 248 nm lithography is required for patterning the small and large TS structures separately as opposed to having to use 193 nm dry lithography or 193 nm immersion lithography. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices including MOSFETs with nitride gate caps.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing two gates laterally separated over and perpendicular to a fin of a semiconductor device, each gate having sidewall spacers and a nitride cap;
forming a conformal silicon nitride (SiN) contact etch stop layer (CESL) on bottom and side surfaces of a trench formed between opposing spacers between the gates;
filling the trench with oxide;
planarizing the spacers, nitride caps, oxide, and CESL;
removing the oxide;
forming a topological flat-SiN layer over the spacers, nitride caps, and CESL;
removing the topological flat-SiN layer from side and bottom surfaces of the trench;
removing the CESL and the topological flat-SiN layer down to a top surface of the spacers; and
performing contact metallization.

2. The method according to claim 1, wherein each gate comprises a metal gate (MG).

3. The method according to claim 1, wherein each spacer comprises a low-k material.

4. The method according to claim 1, comprising forming the CESL to a thickness of 2 nanometer (nm) to 8 nm.

5. The method according to claim 1, comprising removing the oxide by:
reactive ion etching (RIE).

6. The method according to claim 1, wherein 9 nm to 11 nm of the nitride caps are removed with the oxide.

7. The method according to claim 1, comprising forming the topological flat-SiN layer to a thickness of 2 nm to 8 nm above an upper surface of the spacers and CESL.

8. The method according to claim 1, comprising forming the topological flat-SiN layer
using a low plasma density condition.

9. The method according to claim 1, comprising removing the topological flat-SiN layer from side and bottom surfaces of the trench by:
dilute hydrofluoric (dHF) wet etch.

10. The method according to claim 1, comprising removing the CESL by:
a wet or a dry isotropic etch.

11. The method according to claim 6, wherein 9 nm to 11 nm of the topological flat-SiN layer remains above the nitride caps between the spacers subsequent to removing the CESL.

12. A device comprising:
two gates laterally separated over and perpendicular to a fin of a semiconductor device;
a silicon nitride (SiN) cap on top of each gate;
spacers on opposite sides of each gate and nitride cap;
a topological flat-SiN layer on top of each nitride cap between the spacers; and
a metal contact layer on the fin and adjacent to opposing spacers between the gates,
wherein the topological flat-SiN layer is coplanar with an upper surface of the spacers.

13. The device according to claim 12, wherein each gate comprises a metal gate (MG).

14. The device according to claim 12, wherein each spacer comprises a low-k material.

15. A method comprising:
providing two metal gates laterally separated over and perpendicular to a fin of a semiconductor device, each gate having low-k spacers at opposite sides and a nitride cap;
forming a conformal silicon nitride (SiN) contact etch stop layer (CESL) on bottom and side surfaces of a trench formed between opposing spacers between the gates;
filling the trench with oxide;
planarizing the spacers, nitride caps, oxide, and CESL;
removing the oxide by reactive ion etching (ME);
forming a topological flat-SiN layer over the spacers, nitride caps, and CESL using a low plasma density condition;
removing the topological flat-SiN layer from side and bottom surfaces of the trench by a dilute hydrofluoric (dHF) wet etch;
removing the CESL and a portion of the topological flat-SiN layer above an upper surface of the spacers and nitride caps by a wet or a dry isotropic etch; and
performing contact metallization.

16. The method according to claim 15, comprising forming the CESL to a thickness of 2 nanometer (nm) to 8 nm.

17. The method according to claim 15, wherein 9 nm to 11 nm of the nitride caps are removed with the oxide.

18. The method according to claim 15, comprising forming the topological flat-SiN layer to a thickness of 2 nm to 8 nm above an upper surface of the spacers and CESL.

19. The method according to claim 17, wherein 9 nm to 11 nm of the topological flat-SiN layer remains above the nitride caps between the spacers subsequent to removing the CESL.

* * * * *